United States Patent
Smitchger et al.

(10) Patent No.: US 11,715,531 B2
(45) Date of Patent: Aug. 1, 2023

(54) OPEN BLOCK MANAGEMENT USING STORAGE CHARGE LOSS MARGIN CHECKING

(71) Applicant: Micron Technology, Inc., Boise, ID (US)

(72) Inventors: Christopher M. Smitchger, Boise, ID (US); Gary F. Besinga, Boise, ID (US); Renato C. Padilla, Folsom, CA (US); Tawalin Opastrakoon, Boise, ID (US); Sampath K. Ratnam, Boise, ID (US); Michael G. Miller, Boise, ID (US); Vamsi Pavan Rayaprolu, San Jose, CA (US); Ashutosh Malshe, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/210,713

(22) Filed: Mar. 24, 2021

(65) Prior Publication Data

US 2022/0310183 A1    Sep. 29, 2022

(51) Int. Cl.
| | | |
|---|---|---|
| *G11C 16/06* | (2006.01) | |
| *G11C 16/34* | (2006.01) | |
| *G11C 16/26* | (2006.01) | |
| *G11C 16/10* | (2006.01) | |
| *G11C 29/50* | (2006.01) | |

(52) U.S. Cl.
CPC ........ *G11C 16/3418* (2013.01); *G11C 16/105* (2013.01); *G11C 16/26* (2013.01); *G11C 29/50004* (2013.01)

(58) Field of Classification Search
CPC .......... G11C 29/50004; G11C 16/3418; G11C 16/26
See application file for complete search history.

(56) References Cited

U.S. PATENT DOCUMENTS 5,920,501 A * 7/1999 Norman ............. G11C 16/3418
                                                    365/185.11

* cited by examiner

*Primary Examiner* — Uyen Smet
(74) *Attorney, Agent, or Firm* — Lowenstein Sandler LLP

(57) ABSTRACT

A system includes a memory device and a processing device, operatively coupled with the memory device, to perform operations including identifying an amount of storage charge loss (SCL) that has occurred on an open block of the memory device, the open block having one or more erased pages, determining that the amount of SCL satisfies a threshold criterion corresponding to an acceptable amount of SCL to occur on the open block, and responsive to determining that the amount of SCL satisfies the threshold criterion, keeping the open block open for programming the one or more erased pages.

18 Claims, 4 Drawing Sheets

OPEN BLOCK MANAGEMENT USING STORAGE CHARGE LOSS MARGIN CHECKING

TECHNICAL FIELD

Embodiments of the disclosure relate generally to memory sub-systems, and more specifically, relate to open block management using storage charge loss (SCL) margin checking.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
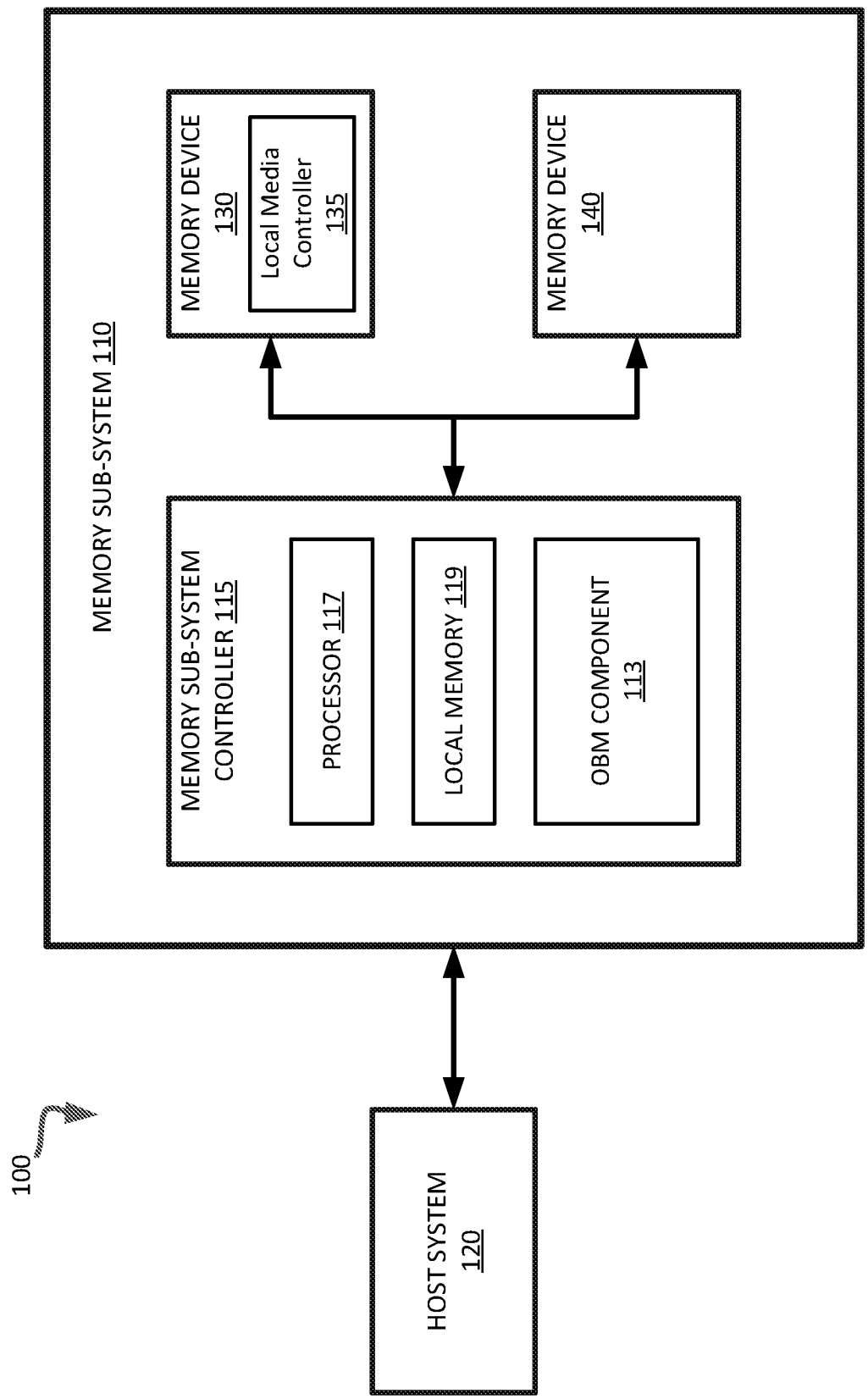
FIG. 1 illustrates an example computing system that includes a memory sub-system in accordance with some embodiments of the present disclosure.

Aspects of the present disclosure are directed to open block storage charge loss (SCL) margin checking. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell. For example, a voltage signal $V_{CG}$ that can be applied to a control electrode of the cell to open the cell to the flow of electric current across the cell, between a source electrode and a drain electrode. More specifically, for each individual memory cell (having a charge Q stored thereon) there can be a threshold control gate voltage $V_T$ (herein also referred to as the "threshold voltage" or simply as "threshold") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The memory cells can, therefore, be characterized by a distribution P of the threshold voltages, $P(Q,V_T) = dW/dV_T$, where dW represents the probability that any given cell has its threshold voltage within the interval $[V_T, V_T+dV_T]$ when charge Q is placed on the cell.

A memory device can have distributions $P(Q,V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels corresponding to known valley margins (e.g., centers of the margins) of the memory device.

One phenomenon observed in memory devices is $V_t$ distribution shift, also referred to herein as temporal voltage shift (TVS). For example, with respect to programmed pages of a block, storage charge loss (SCL) can cause $V_t$ distributions to shift towards lower voltages as charge diminishes over, e.g., time and/or temperature. That is, SCL and the corresponding $V_t$ distribution shift towards lower voltages can be proportional to the elapsed time from a programming operation to a read operation. Conversely, with respect to erased pages of a block, storage charge gain (SCG) can cause $V_t$ distributions to shift towards higher voltages as charge increases over, e.g., time and/or temperature. That is, similar to SCL, SCG and the corresponding $V_t$ distribution shift towards higher voltages can be proportional to the elapsed time from an erase operation to a programming operation. If too much SCG occurs on an erased page, there can be reliability concerns when data is programmed into the erased page. It can be difficult to track and/or predict SCG due to the memory cells being in an erased state. By the time that the SCG for the erased page is sufficiently large enough to be detected, the amount of SCG and corresponding $V_t$ distribution shift may already be a problem for achieving reliable programming.

One method that can be used to address the SCG problem present with programming erased blocks is to erase a block immediately prior to programming usage, and then allow the erased block to exist in an open state (i.e., a currently being programmed state) to be filled for a time limit (e.g., about one hour). After the time limit expires, the erased block is abandoned and a new block can then be opened for data writes for the time limit. By doing this, the erased block can be abandoned prior to being fully filled. This can lead to excess block wear due to having to more frequently partially fill blocks in contrast to fully fill blocks, thereby resulting in an overall decrease in the total bytes written (TBW) capability of the storage device. Moreover, this method can lead to a decrease in performance due to the new block needing to be erased prior to a data write.

Aspects of the present disclosure address the above and other deficiencies by providing a memory sub-system that manages open blocks using storage charge loss (SCL) margin checking. As discussed above, it can be difficult to detect an amount of SCG that has occurred on erased pages of a block. However, an amount of SCL that has occurred on programmed pages of the block generally has a relationship with the amount of SCG that has occurred on the erased pages of the block. Therefore, the memory-subsystem can use the amount of SCL that has occurred on the programmed pages of the block as a proxy for the amount of SCG that has occurred on the erased pages of the block.

To determine the amount of SCL, the memory sub-system can scan programmed wordlines of programmed pages of the open block to measure a value using any suitable scan method, and then compare the value to a known reference to determine the amount of SCL on the programmed pages of the open block. Examples of suitable scan methods include, but are not limited to, direct $V_t$ measurement, read level calibration, read sense current, etc. Since SCL increases over time, the scan can take place on the oldest programmed data (e.g., TLC/QLC data) contained within the oldest programmed pages of the open block to ensure that the amount of SCL is the highest possible amount of SCL that can be determined for the open block, and can be performed at a set time frequency since the oldest programmed page(s) in the open block were programmed. The memory sub-system can then determine whether the amount of SCL satisfies a threshold criterion. For example, the amount of SCL can be compared to a threshold, corresponding to an acceptable amount of SCL, to determine whether to continue using the open block beyond the previously allotted time. More specifically, the threshold criterion is satisfied and the open block will remain open for programming the remaining erased pages if the amount of SCL is less than or equal to the threshold (the amount of SCL is acceptable). The threshold criterion is not satisfied and the open block will be abandoned if the amount of SCL exceeds the threshold and is therefore unacceptable. After abandonment, a new block can then be opened for programming.

The method performed by the memory sub-system described above can be implemented with any suitable memory device architecture in accordance with the embodiments described herein. In one embodiment, the method can be implemented with a memory device implementing replacement gate NAND (RG NAND) technology. A replacement gate (RG) NAND device is a NAND device that implements a RG architecture rather than a floating gate (FG) architecture. The RG NAND architecture removes cell gaps that are typically found in FG NAND architectures, thereby reducing or eliminating capacitance resulting from those cell gaps. More specifically, the RG NAND architecture corresponds to a single-insulator structure. The RG NAND architecture can enable smaller size, improved read and write latency, and increase in transfer rate as compared to the FG NAND architecture.

Advantages of the present disclosure include, but are not limited to, preventing excessive programming/erasing cycles, allowing for accurate prediction of TBW, and improved performance as new blocks will need to be erased less frequently.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes an open block management (OBM) component 113 that can implement open block storage charge loss (SCL) margin checking. The OBM component 113 can scan data programmed on an open block having one or more erased pages to determine an amount of SCL that has occurred on the open block, obtain a threshold corresponding to an acceptable amount of SCL to occur on the open block, and determine whether the amount of SCL exceeds the threshold. Since SCL can function as a proxy for SCG, the determination by the OBM component 113 can be used to determine whether to keep the block open for programming the one or more erased pages. Therefore, if the amount of SCL satisfies a threshold criterion (e.g., is less than or equal to the threshold), the OBM component 113 keeps the open block open for programming the one or more erased pages. Otherwise, the OBM component 113 abandons the open block. The OBM component 113 can then open a new block for programming.

In some embodiments, the memory sub-system controller 115 includes at least a portion of the PV component 113. In some embodiments, the OBM component 113 is part of the host system 110, an application, or an operating system. In other embodiments, local media controller 135 includes at least a portion of OBM component 113 and is configured to perform the functionality described herein. Further details regarding the operation of the OBM component 113 are described below with reference to FIGS. 2 and 3.

Figure 2:
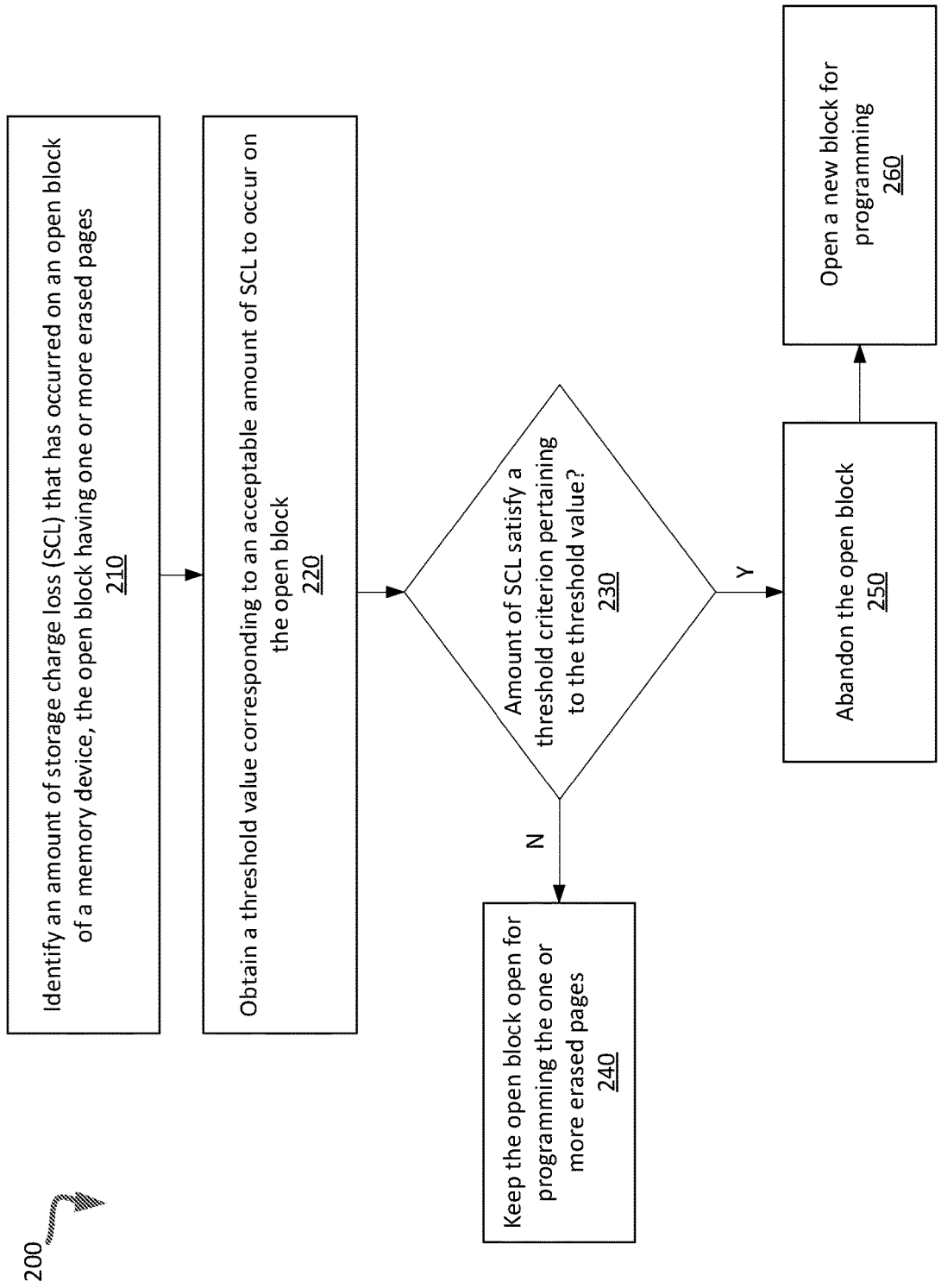
FIG. 2 is a flow diagram of a method for open block management using storage charge loss (SCL) margin checking in accordance with some embodiments of the present disclosure.

FIG. 2 is a flow diagram of an example method 200 for open block management using storage charge loss (SCL) margin checking, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the OBM component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic identifies an amount of storage charge loss (SCL) that has occurred on an open block of a memory device, with the open block having one or more erased pages. For example, the open block can be a NAND block. In some embodiments, determining the amount of SCL includes scanning one or more programmed pages of the open block, and determining the amount of SCL as an amount of SCL that has occurred on the one or more programmed pages based on the scanning. More specifically, one or more programmed wordlines of the one or more programmed pages can be scanned to measure a value, and then the value can be compared to a known reference to determine the amount of SCL on the programmed pages of the open block. Any suitable method can be used to identify the amount of SCL (e.g., at the time of scan). Examples of such methods include, but are not limited to, direct $V_t$ measurement, read level calibration, read sense current, etc. For example, a first measurement can be made immediately after programming, and then a second measurement can be made at some later time. The difference between the first measurement and the second measurement is the measure of the SCL.

The scan can take place on the oldest programmed data (e.g., TLC/QLC data) contained within the oldest programmed page(s) of the open block, at a set time frequency since the oldest programmed page(s) of the open block were programmed. A variety of methods can be implemented to determine the age of data. For example, programming time can be kept in the page metadata and/or in a separate metadata table. A scan could be set up to run every hour starting from the time that the oldest programmed data (e.g., TLC/QLC data) is programmed into the block and until the time that the block is either fully programmed or abandoned due to storage charge gain (SCG). Further details regarding the structure of the open block will be described below with reference to FIG. 3.

At operation 220, the processing logic obtains a threshold value corresponding to an acceptable amount of SCL to occur on the open block. Obtaining the threshold can include determining the threshold value based on characterization data. A number of levels of characterization data may be needed. One level of characterization data includes measurements of the rate of SCL and SCG such that a relationship between SCL and SCG can be obtained. Another level of characterization data includes identification of a pass/fail point by performing reliability testing with various amounts of SCG prior to data programming (e.g., to understand how much SCG is acceptable before the block should be abandoned).

The relationship between SCL and SCG can vary based on a number of factors. Examples of such factors include, but are not limited to, temperature and program/erase cycles that a block has seen. In one example, the ratio of SCL to SCG can be equal to around 1.23:1. Another way of stating this ratio is that every 123 mV of SCL corresponds to 100 mV of SCG.

At operation 230, the processing logic determines whether the amount of SCL satisfies a threshold criterion pertaining to the threshold value. The determination is made for deciding whether to continue using the open block beyond a previously allotted time (e.g., 1 hour). In one embodiment, the threshold criterion is satisfied if the amount of SCL is less than or equal to the threshold value, and the threshold criterion is not satisfied if the amount of SCL exceeds the threshold value.

If the amount of SCL that has occurred on the open block satisfies the threshold criterion (e.g., less than or equal to the threshold value), this means that the amount of SCL that that has occurred on the open block is acceptable. Thus, in view of the relationship between SCL and SCG, the amount of SCG that has occurred on the one or more erased pages of the open block should similarly be acceptable. Therefore, the processing logic keeps the open block open for programming the one or more erased pages at operation 240.

In response to determining that the threshold criterion is not satisfied (e.g., the amount of SCL that has occurred on the open block exceeds the threshold, this amount of SCL that has occurred on the open block is determined to be unacceptable. Thus, in view of the relationship between SCL and SCG, the amount of SCG that has occurred on the one or more erased pages of the open block should similarly be unacceptable (e.g., too high to reliably program) and the open block should be closed for programming. Thus, at operation 250, the processing device abandons the open block. Then, the processing logic can open a new block for programming at operation 260.

After the open block is kept open at operation 240 or after the new block is opened at operation 260, the processing logic can repeat operations 210-230 to identify a second amount of SCL that has occurred on the new open block, obtain the threshold, and determine whether the amount of SCL that has occurred on the new open block satisfies the threshold criterion.

Figure 3:
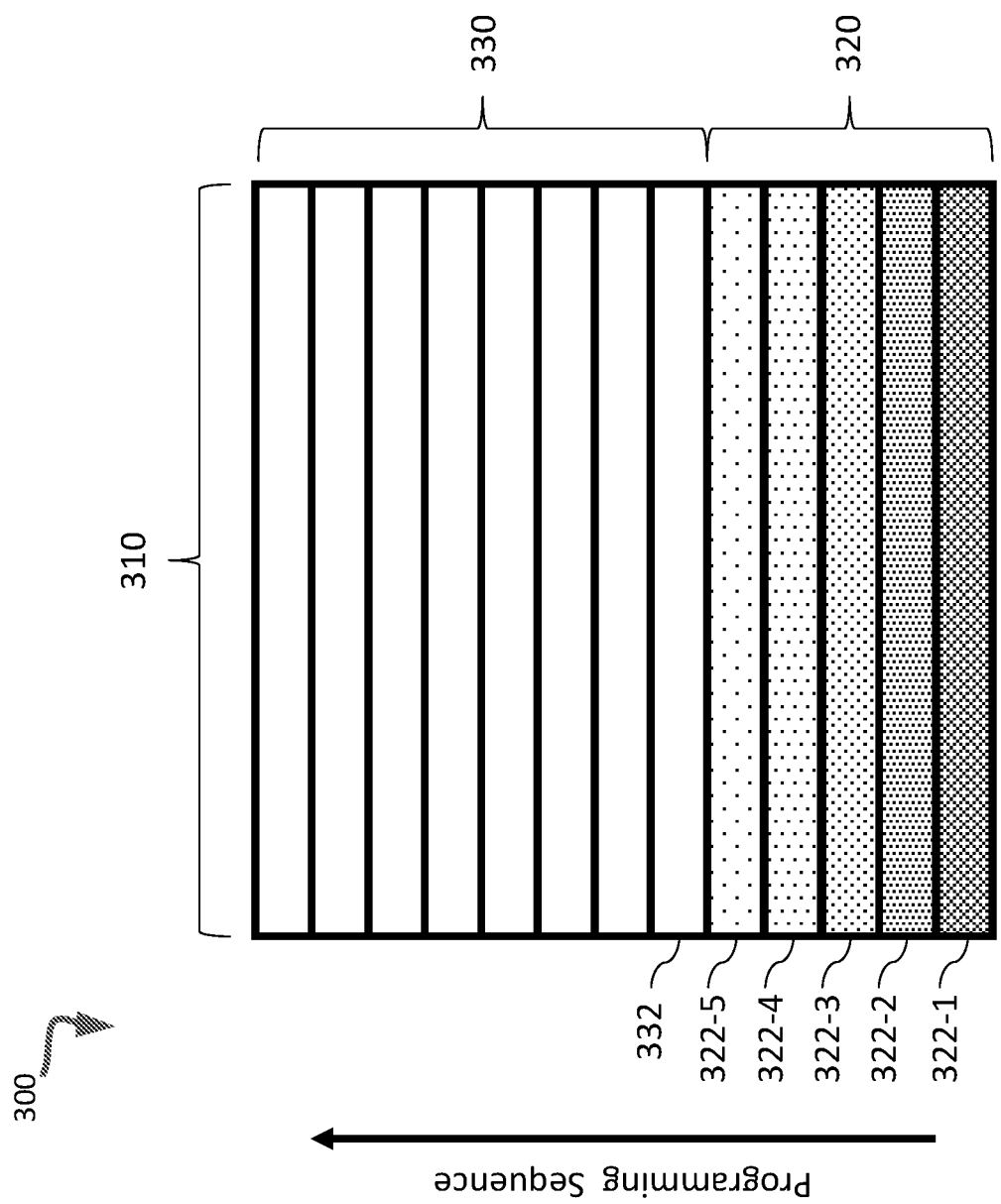
FIG. 3 is a diagram illustrating an open block in accordance with some embodiments of the present disclosure.

FIG. 3 illustrates a diagram 300 illustrating an example open block 310. For example, the open block 310 can be a NAND block. As shown, the block 310 includes a set of programmed pages 320 and a set of erased pages 330. The set of programmed pages 320 includes programmed pages 320-1 through 320-5, where programmed page 320-1 corresponds to the oldest programmed page having the oldest programmed data, and programmed page 320-5 corresponds to the most recent programmed page having the newest programmed data. The set of erased pages 330 includes an erased page 332. The programming sequence goes upwards from the oldest programmed data (e.g., from page 322-1).

As described in further detail above with reference to FIG. 2, a relationship exists between SCL of a programmed page and SCG of an erased page, such that the amount of SCL can be used as a proxy for SCG. Thus, if it is determined that the amount of SCL that has occurred on the open block 310 (e.g., the amount of SCL that has occurred on the page 320-1) satisfies a threshold criterion (e.g., by being less than or equal to a threshold value corresponding to an acceptable amount of SCL), then the open block 310 is kept open for programming at least the erased page 332. Otherwise, the open block 310 is abandoned and a new open block can be opened for programming.

Figure 4:
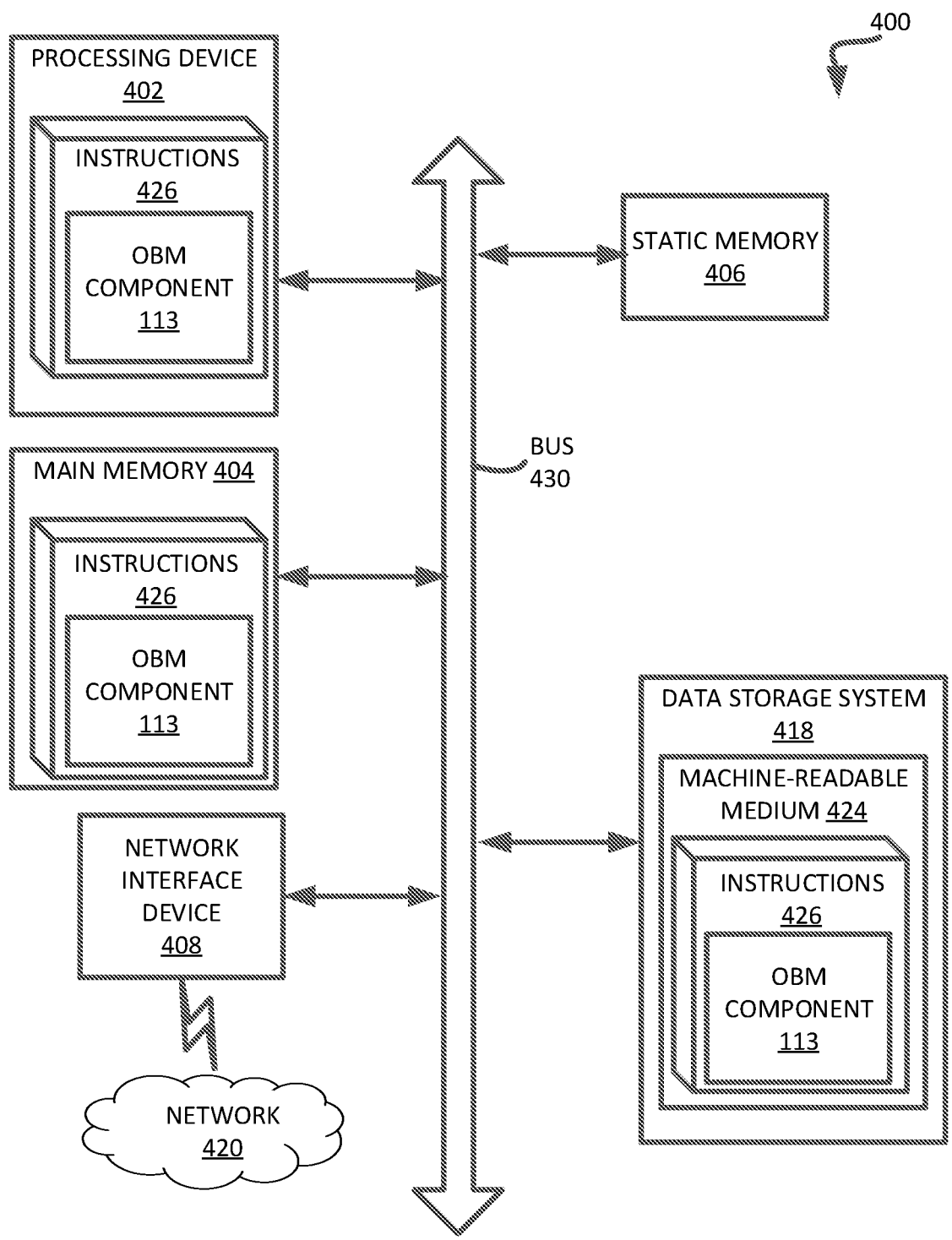
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the OBM component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or RDRAM, etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a PV component (e.g., the OBM component 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a replacement gate memory device comprising an open block, the open block comprising a set of programmed pages and a set of erased pages; and
   a processing device, operatively coupled with the replacement gate memory device, to perform operations comprising:
      identifying an amount of storage charge loss (SCL) that has occurred on an oldest programmed page of the set of programmed pages;
      determining whether the amount of SCL that has occurred on the oldest programmed page satisfies a threshold criterion, the threshold criterion corresponding to an acceptable amount of SCL to occur on the oldest programmed page and an acceptable amount of charge gain to occur on one or more erased pages of the set of erased pages; and
      responsive to determining that the amount of SCL that has occurred on the oldest programmed page satisfies the threshold criterion, keeping the open block open for programming the one or more erased pages of the set of erased pages.

2. The system of claim 1, wherein identifying the amount of SCL that has occurred on the oldest programmed page comprises:
   scanning the oldest programmed page of the open block; and
   determining the amount of SCL that has occurred on the oldest programmed page based on the scanning.

3. The system of claim 2, wherein the oldest programmed page is scanned at a set time frequency since the oldest programmed page was programmed.

4. The system of claim 1, wherein identifying the amount of SCL that has occurred on the oldest programmed page comprises performing at least one of: direct threshold voltage measurement, read level calibration, or read sense current.

5. The system of claim 1, wherein the operations further comprise:
   responsive to determining that the amount of SCL that has occurred on the oldest programmed page does not satisfy the threshold criterion, abandoning the open block.

6. The system of claim 5, wherein the operations further comprise opening a new block for programming after abandoning the open block.

7. A method comprising:
   identifying, by a processing device, an amount of storage charge loss (SCL) that has occurred on an oldest programmed page of a set of programmed pages of an open block of a replacement gate memory device, the open block further comprising a set of erased pages;

determining, by a processing device, whether the amount of SCL that has occurred on the oldest programmed page satisfies a threshold criterion, the threshold criterion corresponding to an acceptable amount of SCL to occur on the oldest programmed page and an acceptable amount of charge gain to occur on one or more erased pages of the set of erased pages; and responsive to determining that the amount of SCL that has occurred on the oldest programmed page satisfies the threshold criterion, keeping, by the processing device, the open block open for programming the one or more erased pages of the set of erased pages.

8. The method of claim 7, wherein identifying the amount of SCL that has occurred on the oldest programmed page comprises performing at least one of: direct threshold voltage measurement, read level calibration, or read sense current.

9. The method of claim 7, wherein identifying the amount of SCL that has occurred on the oldest programmed page comprises:

scanning the oldest programmed page; and determining the amount of SCL that has occurred on the oldest programmed page based on the scanning.

10. The method of claim 9, wherein the oldest programmed page is scanned at a set time frequency since the oldest programmed page was programmed.

11. The method of claim 7, further comprising:

responsive to determining that the amount of SCL that has occurred on the oldest programmed page does not satisfy the threshold criterion, abandoning, by the processing device, the open block.

12. The method of claim 11, further comprising opening, by the processing device, a new block for programming after abandoning the open block.

13. A non-transitory computer-readable storage medium comprising instructions that, when executed by a processing device, cause the processing device to perform operations comprising:

identifying an amount of storage charge loss (SCL) that has occurred on an oldest programmed page of a set of programmed pages of an open block of a replacement gate memory device, the open block further comprising a set of erased pages;

determining whether the amount of SCL that has occurred on the oldest programmed page does not satisfy a threshold criterion, the threshold criterion corresponding to an acceptable amount of SCL to occur on the oldest programmed page and an acceptable amount of charge gain to occur on the set of erased pages; and responsive to determining that the amount of SCL does not satisfy the threshold criterion, abandoning the open block.

14. The non-transitory computer-readable storage medium of claim 13, wherein identifying the amount of SCL comprises:

scanning the oldest programmed page; and determining the amount of SCL that has occurred on the oldest programmed page based on the scanning.

15. The non-transitory computer-readable storage medium of claim 14, wherein the oldest programmed page is scanned at a set time frequency since the oldest programmed page was programmed.

16. The non-transitory computer-readable storage medium of claim 13, wherein identifying the amount of SCL that has occurred on the oldest programmed page comprises performing at least one of: direct threshold voltage measurement, read level calibration, or read sense current.

17. The non-transitory computer-readable storage medium of claim 13, wherein the operations further comprise opening a new block for programming after abandoning the open block.

18. The non-transitory computer-readable storage medium of claim 13, wherein the operations further comprise:

responsive to determining that the amount of SCL that has occurred on the oldest programmed page satisfies the threshold criterion, keeping the open block open for programming one or more erased pages of the set of erased pages.

\* \* \* \* \*